United States Patent
Senthil et al.

(10) Patent No.: US 10,169,362 B2
(45) Date of Patent: Jan. 1, 2019

(54) HIGH-DENSITY COMPRESSION METHOD AND COMPUTING SYSTEM

(71) Applicant: CROSS COMMERCE MEDIA, INC., New York, NY (US)

(72) Inventors: Kumar Senthil, Dublin, CA (US); Kristis Makris, Brooklyn, NY (US)

(73) Assignee: CROSS COMMERCE MEDIA, INC., New York, NY (US)

( * ) Notice: Subject to any disclaimer, the term of this patent is extended or adjusted under 35 U.S.C. 154(b) by 146 days.

(21) Appl. No.: 15/203,917

(22) Filed: Jul. 7, 2016

(65) Prior Publication Data

US 2018/0011869 A1 Jan. 11, 2018

(51) Int. Cl.
G06F 17/30 (2006.01)
H03M 7/30 (2006.01)
H03M 7/40 (2006.01)

(52) U.S. Cl.
CPC .. *G06F 17/30153* (2013.01); *G06F 17/30424* (2013.01); *H03M 7/3068* (2013.01); *H03M 7/3084* (2013.01); *H03M 7/3086* (2013.01); *H03M 7/3088* (2013.01); *H03M 7/40* (2013.01); *H03M 7/4006* (2013.01)

(58) Field of Classification Search
CPC ......... G06F 17/30153; G06F 17/30424; G06F 17/30867; G06F 17/30498; G06F 17/30371
USPC ....................................................... 707/693
See application file for complete search history.

(56) References Cited

U.S. PATENT DOCUMENTS

| | | | |
|---|---|---|---|
| 6,628,411 B2 | 9/2003 | Miller et al. |
| 7,071,848 B1 | 7/2006 | Khu |
| 7,876,252 B1 | 1/2011 | Wegener |
| 8,244,677 B2 | 8/2012 | Baron |
| 8,700,579 B2 | 4/2014 | Apanowicz et al. |
| 8,838,593 B2 | 9/2014 | Apanowicz et al. |
| 8,966,123 B2 | 2/2015 | Gochi Garcia |

(Continued)

OTHER PUBLICATIONS

Holloway et al., "How to Barter Bits for Chronons: Compression and Bandwidth Trade Offs for Database Scans", SIGMOD, Jun. 11-14, 2007, Beijing, China.

(Continued)

*Primary Examiner* — Shahid A Alam
(74) *Attorney, Agent, or Firm* — Troutman Sanders LLP; James Moore Bollinger; Christopher C. Close, Jr.

(57) ABSTRACT

Certain implementations of the disclosed technology may include methods and computing systems for performing high-density data compression, particularly on numerical data that demonstrates various patterns, and patterns of patters. According to an example implementation, a method is provided. The method may include extracting a data sample from a data set, compressing the data sample using a first compression filter configuration, and calculating a compression ratio associated with the first compression filter configuration. The method may also include compressing the data sample using a second compression filter configuration and calculating a compression ratio associated with the second compression filter configuration. A particular compression filter configuration to utilize in compressing the entire data set may be selected based on a comparison of the compression ratio associated with the first compression filter configuration and a compression ratio associated with the second compression filter configuration.

15 Claims, 7 Drawing Sheets

(56) References Cited

U.S. PATENT DOCUMENTS

| | | |
|---|---|---|
| 9,367,557 B1 | 6/2016 | Lin et al. |
| 2014/0229186 A1 | 8/2014 | Mehrotra et al. |
| 2015/0319441 A1 | 11/2015 | Puri et al. |
| 2016/0094242 A1 | 3/2016 | Ackerman et al. |

OTHER PUBLICATIONS

Le Dem et al., "Parquet columnar storage for the people", Strata Conference, Hadoop World, Oct. 28-30, 2013, New York, NY.
O'Sullivan, "Choosing an HDFS data storage format: Avro vs. Parquet and more", http://www.slideshare.net/StampedeCon/choosing-an-hdfs-data-storage-format-avro-vs-parquet-and-more-stampedecon-2015.
Slezak, et al., "Brighthouse: An Analytic Data Warehouse for Ad-hoc Queries", PVLDB, pp. 1337-1345, 2008.
Search Report and Written Opinion for corresponding International Application No. PCT/US2017/040843, dated Sep. 13, 2017.

HIGH-DENSITY COMPRESSION METHOD AND COMPUTING SYSTEM

BACKGROUND

Data compression involves encoding information using fewer bits than the original representation. Data compression techniques may be utilized to reduce data storage and retrieval expenses, improve data query performance, and provide deeper analytics than what would be available using uncompressed data.

For example, cloud computing has emerged as a preferred avenue for storing data. However, the cost associated with storing data on the cloud is proportional to the amount of data being stored—the more data, the higher the cost. In addition, there is a cost associated with retrieving data from the cloud—the more frequently data is retrieved, the higher the cost. Thus, data storage and retrieval costs may prove prohibitive for many entities. This is especially true in the age of "big data," where entities may need to store, quickly access, and quickly analyze massive amounts of data.

Data compression techniques may also be utilized to reduce disk I/O because less data blocks are used to save the data. This has the potential of improving query execution performance overall, because less time is spent waiting for disk I/O when answering a query.

Further still, data compression techniques may be leveraged to provide deeper answers to business questions in an application service provider environment by furnishing access to a larger set of historical data. Storing tenant data for multiple years (e.g., 10 years) instead of only a few years (e.g., 2 years) provides a larger and richer data powered ecosystem for data mining and other analytical endeavors. Such richer insights from data mining efforts may be incorporated into the data available for answering business questions.

Conventional data compression techniques have proven suboptimal for compressing data in the "big data" era. For example, many conventional data compression techniques rely on a static configuration of compression filters arranged in a static, pre-determined sequence. While such static configurations may perform suitably on some types of data, these configurations perform sub-optimally on other types of data. This is particularly true as it relates to conventional data compression techniques abilities to compress patterned numerical data. Accordingly, improved methods and computing systems for performing high-density compression on patterned numerical data are desired.

SUMMARY

The disclosed technology provides computing systems and methods for compressing data that follows common patterns, and patterns of patterns, to extremely high ratios. Depending on the patterns encountered, the systems and techniques set forth herein may compresses 100,000 data elements up to 679×, 18918×, 37500×, or more. These are often sets of machine-generated data, such as data generated for high-performance decision-support and analytical processing, data generated for a business intelligence application service provider, and/or data stored in a column-oriented RDBMS, where data elements often, but not always, demonstrate a mathematical relationship with each other.

In exemplary embodiments, the disclosed technology may function as a sequence of compression filters. Each compression filter in the sequence may be configured to identify common patterns—and patterns of patterns—in numeric data, encode the patterns involved as mathematical expressions that consume less storage space than the original data, remove the data that has been encoded, and then pass the data on to the next compression filter in the sequence. In some embodiments, a given compression filter may operate on mathematical expressions encoded by a previous filter instead of operating on the remaining data. The compression filters may be selected as a combination of (i) manually chosen filters that generally compress well, like Range Encoding, (ii) dynamically chosen filters that reduce the required storage space as much as possible through the testing of candidate compression filters effectiveness on a sample of data elements (e.g., 10,000 data elements) from a larger data set, and/or (ii) by using other measures of compression effectiveness, such as entropy.

Although some of the compression algorithms involved are already known to those having ordinary skill in the art, the disclosed technology presents several new compression algorithms (e.g., Dictionary Run-Length Encoding, Dictionary Run-Length Encoding of Run-Length Encoded Dictionaries, and Week Of Encoding), which may be purpose-built for compressing high-performance data such as decision-support data, analytical processing data, data for a business intelligence application service provider, data stored in a column-oriented RDBMS, or other similar data stores.

Although the disclosed technology focuses on compressing numeric data, those having ordinary skill in the art will appreciate that the computing systems and techniques set forth herein may be suitably applied to other types of data as well including, but not limited to, alphanumeric, string, and decimal data. Furthermore, date, time, datetime, and boolean data may also be processed by the disclosed technology without any modifications, because these data types can all be mapped to numeric data using techniques known in the art.

In exemplary embodiments, the disclosed technology provides for the dynamic selection of an optimal compression filter configuration. The effectiveness of a given compression filter configuration (as measured by, for example, the compression ratio achieved by the compression filter configuration) is constrained by the type of data being compressed. That is to say, there is no single compression filter configuration that will perform optimally for all possible patterns of data (i.e., achieve the best possible compression ratio across all possible patterns of data)—data compression ratio always depends on the patterns inherent in the data. Accordingly, exemplary embodiments of the disclosed technology provide for the dynamic selection of which compression filters to utilize to compress the data (from among a set of available compression filters), and the arrangement—or sequence of those different compression filters in order to select a compression filter configuration that yields the highest compression ratio possible.

Among other advantages, the disclosed technology provides for the compression of numeric data that follow common patterns and "patterns of patterns" at higher compression ratios than conventional data compression techniques. In some example, the disclosed technology has produced extreme compression ratios of up to 37500× for 100,000 data elements. In addition, the disclosed technology has demonstrated improved query execution times because less data blocks must be received from disk as compared to conventional systems. Further, the disclosed technology has proven particularly effective in achieving higher compression ratios of multi-tenant data. Some data patterns are more frequent in multi-tenant ecosystems (i.e., computing eco systems storing data from several different tenants). Accordingly, the disclosed technology detects and synthesizes data patterns, and selects the optimal compression filter configuration for the particular data sought to be compressed in order to achieve optimal compression ratios.

BRIEF DESCRIPTION OF THE FIGURES

Reference will now be made to the accompanying Figures, which are not necessarily drawn to scale, and wherein.

DETAILED DESCRIPTION

Some implementations of the disclosed technology will be described more fully with reference to the accompanying drawings. This disclosed technology may, however, be embodied in many different forms and should not be construed as limited to the implementations set forth herein.

Example implementations of the disclosed technology provide methods and computing systems for performing high-density data compression.

Example implementations of the disclosed technology will now be described with reference to the accompanying figures.

Figure 1:
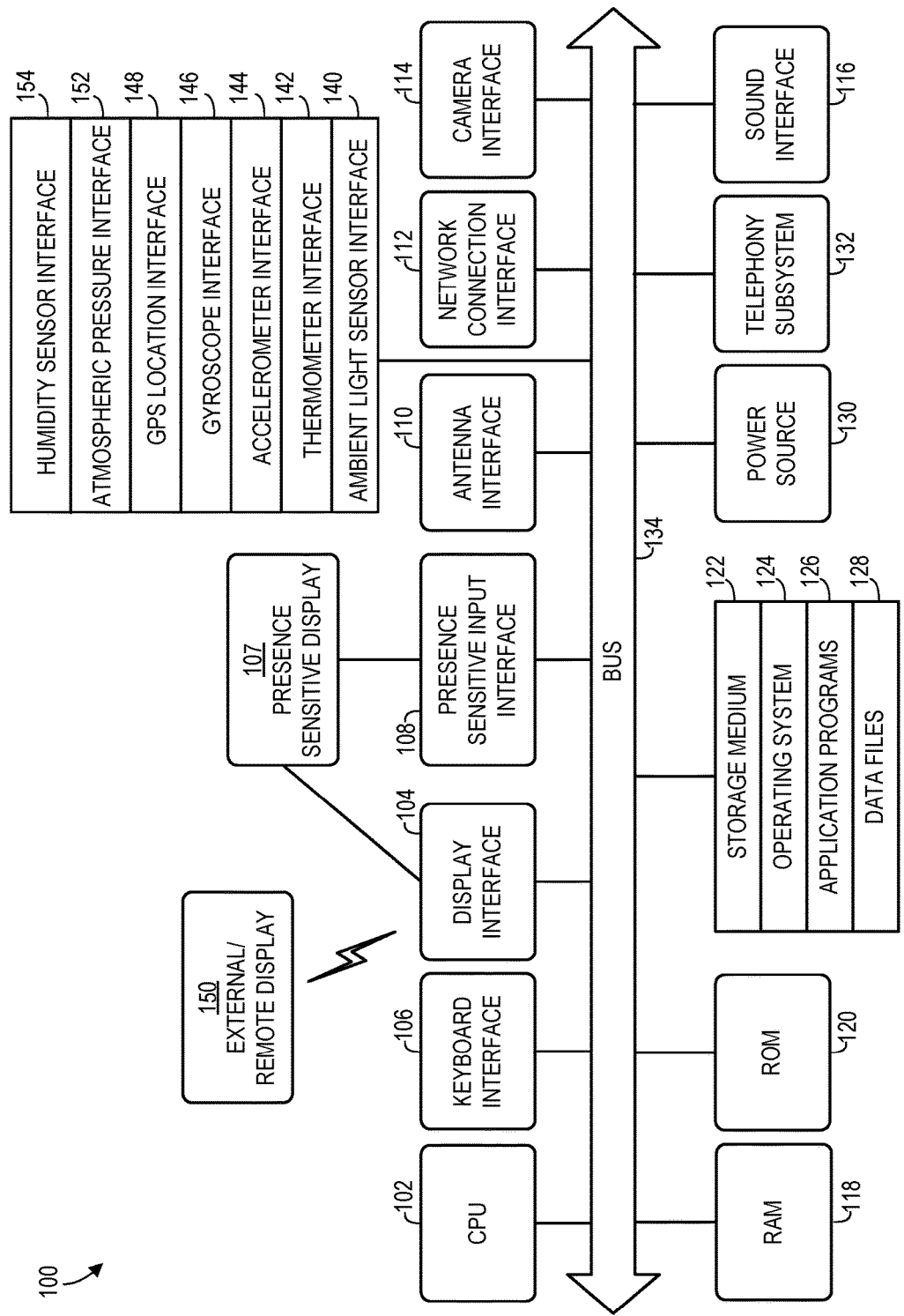
FIG. 1 depicts computing system architecture 100, according to an example implementation of the disclosed technology.

As desired, implementations of the disclosed technology may include a computing device with more or less of the components illustrated in FIG. 1. The computing device architecture 100 is provided for example purposes only and does not limit the scope of the various implementations of the present disclosed computing systems, methods, and computer-readable mediums.

The computing device architecture 100 of FIG. 1 includes a central processing unit (CPU) 102, where executable computer instructions are processed; a display interface 104 that supports a graphical user interface and provides functions for rendering video, graphics, images, and texts on the display. In certain example implementations of the disclosed technology, the display interface 104 connects directly to a local display, such as a touch-screen display associated with a mobile computing device. In another example implementation, the display interface 104 provides data, images, and other information for an external/remote display 150 that is not necessarily physically connected to the mobile computing device. For example, a desktop monitor can mirror graphics and other information presented on a mobile computing device. In certain example implementations, the display interface 104 wirelessly communicates, for example, via a Wi-Fi channel or other available network connection interface 112 to the external/remote display.

In an example implementation, the network connection interface 112 can be configured as a wired or wireless communication interface and can provide functions for rendering video, graphics, images, text, other information, or any combination thereof on the display. In one example, a communication interface can include a serial port, a parallel port, a general purpose input and output (GPIO) port, a game port, a universal serial bus (USB), a micro-USB port, a high definition multimedia (HDMI) port, a video port, an audio port, a Bluetooth port, a near-field communication (NFC) port, another like communication interface, or any combination thereof.

The computing device architecture 100 can include a keyboard interface 106 that provides a communication interface to a physical or virtual keyboard. In one example implementation, the computing device architecture 100 includes a presence-sensitive display interface 108 for connecting to a presence-sensitive display 107. According to certain example implementations of the disclosed technology, the presence-sensitive input interface 108 provides a communication interface to various devices such as a pointing device, a capacitive touch screen, a resistive touch screen, a touchpad, a depth camera, etc. which may or may not be integrated with a display.

The computing device architecture 100 can be configured to use one or more input components via one or more of input/output interfaces (for example, the keyboard interface 106, the display interface 104, the presence sensitive input interface 108, network connection interface 112, camera interface 114, sound interface 116, etc.,) to allow the computing device architecture 100 to present information to a user and capture information from a device's environment including instructions from the device's user. The input components can include a mouse, a trackball, a directional pad, a track pad, a touch-verified track pad, a presence-sensitive track pad, a presence-sensitive display, a scroll wheel, a digital camera including an adjustable lens, a digital video camera, a web camera, a microphone, a sensor, a smartcard, and the like. Additionally, an input component can be integrated with the computing device architecture 100 or can be a separate device. As additional examples, input components can include an accelerometer, a magnetometer, a digital camera, a microphone, and an optical sensor.

Example implementations of the computing device architecture 100 can include an antenna interface 110 that provides a communication interface to an antenna; a network connection interface 112 can support a wireless communication interface to a network. As mentioned above, the display interface 104 can be in communication with the network connection interface 112, for example, to provide information for display on a remote display that is not directly connected or attached to the system. In certain implementations, a camera interface 114 is provided that acts as a communication interface and provides functions for capturing digital images from a camera. In certain implementations, a sound interface 116 is provided as a communication interface for converting sound into electrical signals using a microphone and for converting electrical signals into sound using a speaker. According to example implementations, a random access memory (RAM) 118 is provided, where executable computer instructions and data can be stored in a volatile memory device for processing by the CPU 102.

According to an example implementation, the computing device architecture 100 includes a read-only memory (ROM) 120 where invariant low-level system code or data for basic system functions such as basic input and output (I/O), startup, or reception of keystrokes from a keyboard are stored in a non-volatile memory device. According to an example implementation, the computing device architecture 100 includes a storage medium 122 or other suitable type of memory (e.g. such as RAM, ROM, programmable read-only memory (PROM), erasable programmable read-only memory (EPROM), electrically erasable programmable read-only memory (EEPROM), magnetic disks, optical disks, floppy disks, hard disks, removable cartridges, flash drives), for storing files include an operating system 124, application programs 126 (including, for example, a web browser application, a widget or gadget engine, and or other applications, as necessary), and data files 128. According to an example implementation, the computing device architecture 100 includes a power source 130 that provides an appropriate alternating current (AC) or direct current (DC) to power components.

According to an example implementation, the computing device architecture 100 includes a telephony subsystem 132 that allows the device 100 to transmit and receive audio and data information over a telephone network. Although shown as a separate subsystem, the telephony subsystem 132 may be implemented as part of the network connection interface 112. The constituent components and the CPU 102 communicate with each other over a bus 134.

According to an example implementation, the CPU 102 has appropriate structure to be a computer processor. In one arrangement, the CPU 102 includes more than one processing unit. The RAM 118 interfaces with the computer bus 134 to provide quick RAM storage to the CPU 102 during the execution of software programs such as the operating system, application programs, and device drivers. More specifically, the CPU 102 loads computer-executable process steps from the storage medium 122 or other media into a field of the RAM 118 in order to execute software programs. Data can be stored in the RAM 118, where the data can be accessed by the computer CPU 102 during execution. In one example configuration, the device architecture 100 includes at least 128 MB of RAM, and 256 MB of flash memory.

The storage medium 122 itself can include a number of physical drive units, such as a redundant array of independent disks (RAID), a floppy disk drive, a flash memory, a USB flash drive, an external hard disk drive, thumb drive, pen drive, key drive, a High-Density Digital Versatile Disc (HD-DVD) optical disc drive, an internal hard disk drive, a Blu-Ray optical disc drive, or a Holographic Digital Data Storage (HDDS) optical disc drive, an external mini-dual in-line memory module (DIMM) synchronous dynamic random access memory (SDRAM), or an external micro-DIMM SDRAM. Such computer readable storage media allow a computing device to access computer-executable process steps, application programs and the like, stored on removable and non-removable memory media, to off-load data from the device or to upload data onto the device. A computer program product, such as one utilizing a communication system, can be tangibly embodied in storage medium 122, which can include a machine-readable storage medium.

According to one example implementation, the term computing device, as used herein, can be a CPU, or conceptualized as a CPU (for example, the CPU 102 of FIG. 1). In this example implementation, the computing device (CPU) can be coupled, connected, and/or in communication with one or more peripheral devices, such as display. In another example implementation, the term computing device, as used herein, can refer to a mobile computing device such as a smartphone, tablet computer, or smart watch. In this example implementation, the computing device outputs content to its local display and/or speaker(s). In another example implementation, the computing device outputs content to an external display device (e.g., over Wi-Fi) such as a TV or an external computing system.

In example implementations of the disclosed technology, a computing device includes any number of hardware and/or software applications that are executable to facilitate any of the operations. In example implementations, one or more I/O interfaces facilitate communication between the computing device and one or more input/output devices. For example, a universal serial bus port, a serial port, a disk drive, a CD-ROM drive, and/or one or more user interface devices, such as a display, keyboard, keypad, mouse, control panel, touch screen display, microphone, etc., can facilitate user interaction with the computing device. The one or more I/O interfaces can be utilized to receive or collect data and/or user instructions from a wide variety of input devices. Received data can be processed by one or more computer processors as desired in various implementations of the disclosed technology and/or stored in one or more memory devices.

One or more network interfaces can facilitate connection of the computing device inputs and outputs to one or more suitable networks and/or connections; for example, the connections that facilitate communication with any number of sensors associated with the system. The one or more network interfaces can further facilitate connection to one or more suitable networks; for example, a local area network, a wide area network, the Internet, a cellular network, a radio frequency network, a Bluetooth enabled network, a Wi-Fi enabled network, a satellite-based network any wired network, any wireless network, etc., for communication with external devices and/or systems.

Figure 2:
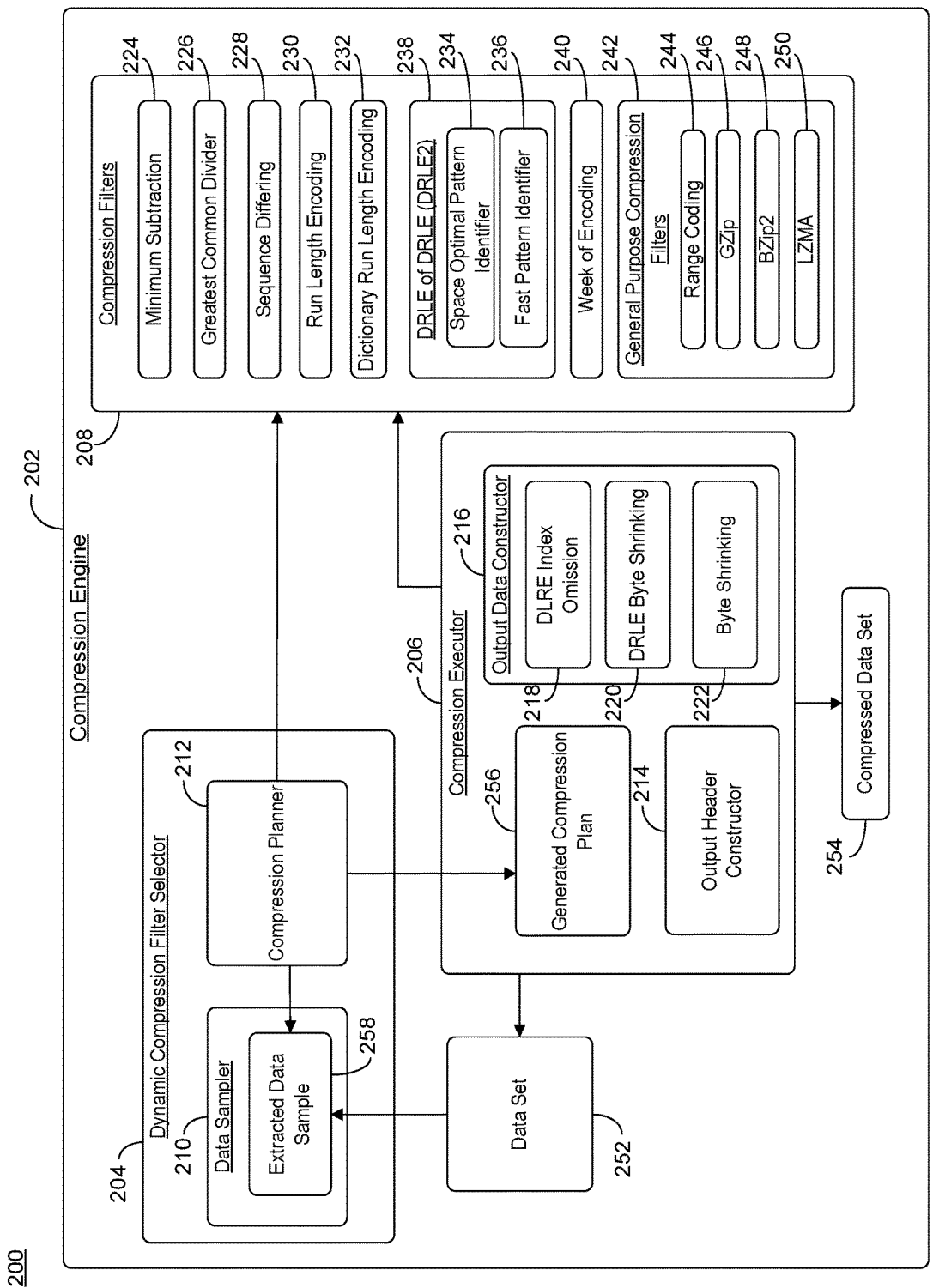
FIG. 2 illustrates an exemplary computing system for performing high-density data compression.

FIG. 2 illustrates an exemplary computing system 200 suitable for use in performing high-density data compression in accordance with the techniques disclosed herein. The computing system 200 can represent one or more implementations of the computing device architecture 100 described above with regard to FIG. 1. For example, the computing system 200 can be implemented as a server computer, mainframe computer, mobile phone, smart phone, tablet, laptop computer, desktop computer, or any other suitable device capable of performing the functionality described herein. The computing system includes a compression engine 202. The compression engine 202 includes a dynamic compression filter selector 204, a compression executor 206, and a plurality of different compression filters 208. In various embodiments, the compression engine 202, the dynamic compression filter selector 204, the compression executor 206, and the plurality of different compression filters 208 may be implemented as software routines executed by one or more processors (e.g., one or more CPUs). However, in other embodiments, the compression engine 202, the dynamic compression filter selector 204, the compression executor 206, and the plurality of different compression filters 208 may be implemented in hardware or firmware. For example, in some embodiments, the compression engine 202, the dynamic compression filter selector 204, the compression executor 206, and the plurality of different compression filters 208 may be implemented as one or more application specific integrated circuits (ASICs), field-programmable gate arrays (FPGAs), state machines, analog circuits, or any other suitable hardware configuration known in the art.

The dynamic compression filter selector 204 includes a data sampler 210 and compression planner 212. The compression executor 206 includes an output header constructor 214 and an output data constructor 216. The compression filters 208 may include a plurality of different types of compression filters such as, but not limited to, a minimum subtraction compression filter 224, a greatest common divider compression filter 226, a sequence differing compression filter 228, a run length encoding compression filter 230, a dictionary run length encoding (DRLE) compression filter 232, a dictionary run length encoding of run length encoded dictionaries (DRLE2) compression filter 238, a week of encoding compression filter 240, and a plurality of general purpose compression filters 242. The functionality of the various compression filters 208 are described in further detail below.

In the embodiment shown in FIG. 2, the DRLE of DRLE (DRLE2) compression filter 238 includes a space optimal pattern identifier 234 and a fast pattern identifier 236, which are discussed in further detail below. Further, in the embodiment shown in FIG. 2, the general purpose compression filters 242 include a range coding compression filter 244, a GZip compression filter 246, a BZip2 compression filter 248, and a LZMA compression filter 250. Again, the foregoing listing of compression filters is merely illustrative in nature, and additional compression filters known to those of skill in the art may be included as part of the compression filters 208 without deviating from the teachings herein.

In operation, the compression engine 202 may dynamically select an optimal compression filter configuration for compressing data based on the nature of the data, and then compress that data, as follows. The data sampler 210 of the compression filter selector 204 is configured to extract a data sample 258 from a data set 252. In one example, the data sample may comprise 10,000 rows of data from a table of data. However, the extracted data sample 258 may be of any size (provided it is less than the size of the data set 252 to which is belongs) without deviating from the teachings herein. The compression planner 212 of the dynamic compression filter selector 204 is configured to read the extracted data sample 258, compress the extracted data sample 258 using a plurality of different compression filter configurations, and identify the optimal compression filter configuration (i.e., the compression filter configuration that yielded the highest compression ratio). Once the optimal compression filter configuration is identified, the compression planner 212 is configured to generate a compression plan 256 that may be communicated to the compression executor 206 for use in compressing the entire data set 252. The manner in which the compression planner 212 identifies the optimal compression filter configuration is described in further detail with regard to FIG. 3 below. In one embodiment, the compression planner 212 dynamically identifies the optimal compression filter configuration at run time. In another embodiment, the compression planner 212 may statically identify the optimal compression filter configuration at compile time (e.g., from among preconfigured combinations of various compression filters 208).

The compression executor 206 is configured to read the data set 252, and execute the generated compression plan 256 to compress the data set 252 using the optimal compression filter configuration to provide a compressed data set 254. In some embodiments, the output header constructor 214 of the compression executor 206 is configured to dynamically construct metadata that will be stored as part of the compressed data set 254. The constructed metadata may include, for example, the maximum width of all values. For example, if the compression executor 206 is compressing numeric data in the range of 0-255 bits, the width is one (1) byte and this information may be included as part of the metadata that will be stored as part of the compressed data set 254. Similarly, and continuing with the foregoing example, if the compression executor 206 is compressing numeric data in the range of 0-32,767 bits, the width is two (2) bytes and this information may be included as part of the metadata that will be stored as part of the compressed data set 254. In another example, the metadata stored as part of the compressed data set 254 may include an algorithmic note to identify the greatest common divisor (GCD). In some embodiments, the output data constructor 216 of the compression executor 206 is configured to optimize parts of the compressed data set 254 to reduce the size of the encoded, compressed data set 254. For example, the output data constructor 216 may further reduce the size of the compressed data set 254 by performing DRLE index omission 218, DRLE byte shrinking 220, data byte shrinking 222, and/or range coding 244.

The compression filters 208 that may serve as candidates for inclusion in an optimal compression filter configuration operate as follows. The minimum subtraction compression filter 224 identifies the minimum value of all data elements, saves it, and subtracts it from all values. To decompress, each data element has the minimum value added to it.

The greatest common divider compression filter 226 identifies the greatest common divisor (GCD) among all data elements, saves it, and divides all values by the GCD. To decompress, each data element is multiplied by the GCD.

The sequence differing compression filter 228 subtracts pairs of subsequent data elements (e.g., between element n and element n+1) with each other and changes the following element (e.g., element n+1) to store only their difference. To correctly encode negative difference values, the values can have added to them: max_value−min_value+1. To decompress, the first element is used as is. The second element is reconstructed by adding the difference of the second element to the first element. The third element is reconstructed by adding the difference of the third element to the value of the reconstructed second element, and so on until all elements are reconstructed. This filter appears to depend on running the DataFilt_Min filter first to guarantee that no values are negative.

The run length encoding compression filter 230 encodes runs of data values: sequences in which the same data value occurs in many consecutive data elements. The run length encoding compression filter stores the runs of data as a single data value and count, rather than as the original run. This is most useful on data that contains many such runs. Run length encoding is typically utilized when the source information includes long substrings of the same character or binary digit.

The range coding compression filter 244 applies an entropy encoding method. Given a stream of symbols and their probabilities, range encoding produces a space efficient stream of bits to represent these symbols and, given the stream and the probabilities, a range decoder reverses the process.

The GZip compression filter 246 performs data compression using Lempel-Ziv coding (LZ77). Whenever possible, each file is replaced by one with the extension .gz, while keeping the same ownership modes, access and modification times. Gzip will only attempt to compress regular files. In particular, it will ignore symbolic links. If the compressed file name is too long for its file system, gzip truncates it. If the name consists of small parts only, the longest parts are truncated. Compressed files can be restored to their original form using gzip−d or gunzip or zcat. If the original name saved in the compressed file is not suitable for its file system, a new name is constructed from the original one to make it legal.

The BZip2 compression filter 248 uses the Burrows-Wheeler algorithm to perform data compression. Specifically, the Bzip2 compression filter 248 compresses data in blocks of size between 100 and 900 kB and uses the Burrows-Wheeler transform to convert frequently-recurring character sequences into strings of identical letters. It then applies move-to-front transform and Huffman coding.

The LZMA compression filter 250 uses the Lempel-Ziv-Markov chain algorithm to perform lossless data compression. Specifically, the LZMA compression filter 250 uses a dictionary compression scheme somewhat similar to the LZ77 algorithm published by Abraham Lempel and Jacob Ziv in 1977 and features a high compression ratio and a variable compression-dictionary size, while still maintaining decompression speed similar to other commonly used compression algorithms The byte shrinking compression filter 222 identifies the maximum value used among all data elements, calculates the number of bytes needed to store that value, and shrinks the storage space allocated for the values to use only that many bytes. The byte shrinking compression filter 222 saves the number of bytes needed. To reconstruct, all values are expanded to the original width of the datatype (e.g., numeric data type). If the byte shrinking compression filter 222 is used in a database system with numeric datatype, the reconstruction may conservatively assume the numeric datatype is an 8-byte BIGINT datatype, which is large enough to store the datatype of any numeric data element, and allow the database system to cast the value to the appropriate datatype. Since the database system knows the datatype of the value, this allows the compressed storage format to be smaller, because the datatype of the column does not need to be saved in the compressed storage format.

In addition to the foregoing compression filters known to those of skill in the art, the disclosed technology presents new compression filters that may be utilized as part of an optimal compression filter configuration for compressing a data set 252.

The dictionary run length encoding (DRLE) compression filter 232 is best understood in contrast to traditional run length encoding discussed above. Run-Length Encoding (RLE) is efficient when encoding long runs. However, RLE is inefficient when encoding values that have only a few long runs and many short ones, because then the amount of data needed to encode each of the many short runs (e.g. runs of 1 or 2 values) may consume more space than the space saved by encoding the few long runs. DRLE seeks to address the inefficiencies inherent in RLE. DRLE operates similar to RLE, but with two differences: (a) the dictionary is encoded separately, instead of encoded in the same stream as the data, and (b) the dictionary contains the index where each run started. These two differences allow encoding the few long runs separately without encoding short runs at all. Short runs of data remain untouched in the original data.

To compress, the DRLE compression filter 232 creates a new DRLE entry for every new value processed, and the entry includes the index of the data element. If the following x numbers of values are the same as the value in the last DRLE entry, the number of repetitions in the DRLE entry is incremented to express the number of repetitions in the run. The minimum number of values to consider is selected so that the storage space consumed by the DRLE index would be at least equal or less than the size of the data that are encoded. For some data, this number of values has been determined to be a run of four repeating values. If the following x number of values are not the same, the last DRLE entry may be deleted, since the attempt to identify a sufficiently long run was unsuccessful. To reconstruct, the runs represented by each DRLE entry are inserted in the new data in the corresponding index saved by the DRLE entry.

As discussed above, in some embodiments, the output data constructor 216 may further reduce the size of the compressed data set 254 by performing DRLE index omission 218 and/or DRLE byte shrinking 220. DRLE index omission 218 is designed to optimize the storage used for DRLE. Specifically, because DRLE also saves the index of each run, the space consumed by a DRLE entry may be larger than the space consumed by a traditional RLE entry. Accordingly, in cases where all data have been encoded with DRLE, the index of each run is not saved at all. This process constitutes DRLE index omission 218. DRLE byte shrinking 220 is designed to shrink the size of each DRLE entry to its minimum by leveraging the fact that the maximum value and the size of the highest number of repetitions are stored across all DRLE entries. More specifically, the byte shrinking technique identifies the maximum value used among all data elements, calculates the number of bytes needed to store that value, and shrinks the storage space allocated for the values to use only that many bytes. The byte shrinking compression filter saves the number of bytes needed to represent a given data value. To reconstruct, all values are expanded to the original width of the datatype (e.g., numeric data type). When the byte shrinking compression filter is used in a database system with numeric datatype, the reconstruction may, in some embodiments, conservatively assume the numeric datatype is an 8-byte BIGINT datatype, which is large enough to store the datatype of any numeric data element, and allow the database system to cast the value to the appropriate datatype. Since the database system knows the datatype of the value, this allows the compressed storage format to be smaller, because the datatype of the column does not need to be saved in the compressed storage format. When DRLE is used in conjunction with Byte Shrinking, this results in significant compression.

In some embodiments, DRLE index omission 218 and DRLE byte shrinking 220 may be combined, which can result in dictionary savings of 3x-8x. In one example, the size of one DRLE entry (4 bytes for index+8 bytes for BIGINT value+4 bytes for number of repetitions of this value=16 bytes) was reduced down to a total of 5 bytes (index omitted, 3 bytes used for value, 2 bytes for repetitions) for dictionary savings of 3x. The maximum reduction may be from 16 bytes down to only 2 bytes for 8x dictionary savings.

In some embodiments, the disclosed technology may perform forced DRLE. In such embodiments, the storage used for DRLE to force all data elements to be expressed as DRLE entries may be optimized even if the values do not repeat for a minimum of x (e.g., x=4) values. Doing this means only DRLE entries will be encoded—no data. Consequently, the index field of each DRLE entry can be omitted from the encoding, resembling the RLE algorithm, which saves space. In this sense, the DRLE compression filter 232 may adaptively become a RLE compression filter 230. Determination of whether all data elements should be forced as DRLE entries may happen, in some embodiments, dynamically based on an estimate of the storage savings. For example, when the number of data elements that are not expressed as DRLE entries is a small percentage of the total elements, say less than 0.1% or less than 1% of the data elements (e.g., less than 100 data elements out of 100,000 data elements) this forcing may be enforced.

In some embodiments, the DRLE compression filter 232 may function without having previously compressed the data using the sequence differing compression filter 228, resulting in a DRLE dictionary that is half as large. The reason is that the dictionary may end up having indexes for high occurrence patterns (e.g., with counts of 91 for sales quarters, as discussed in the context of the DRLE2 compression filter 238 below) broken up by indexes of occurrence 1 (count of 1) when a sequence stops and a new sequence starts. This ends up adding one more index for each index. That is because the difference between the two values at the sequence change point is no longer the value 1, which leads to generating a new index. As an illustrative, but not limiting example, without sequence differencing the following sequence of values may be represented with only two DRLE entries: 000111. However, if the sequence differing compression filter 228 is enabled, it may alter the preceding sequence of values as follows: 001001. The altered sequence of values requires four DRLE entries instead of only two, thereby doubling the size of the DRLE dictionary. As an optimization, in some embodiments, the sequence differencing compression filter 228 is disabled.

Figure 5:
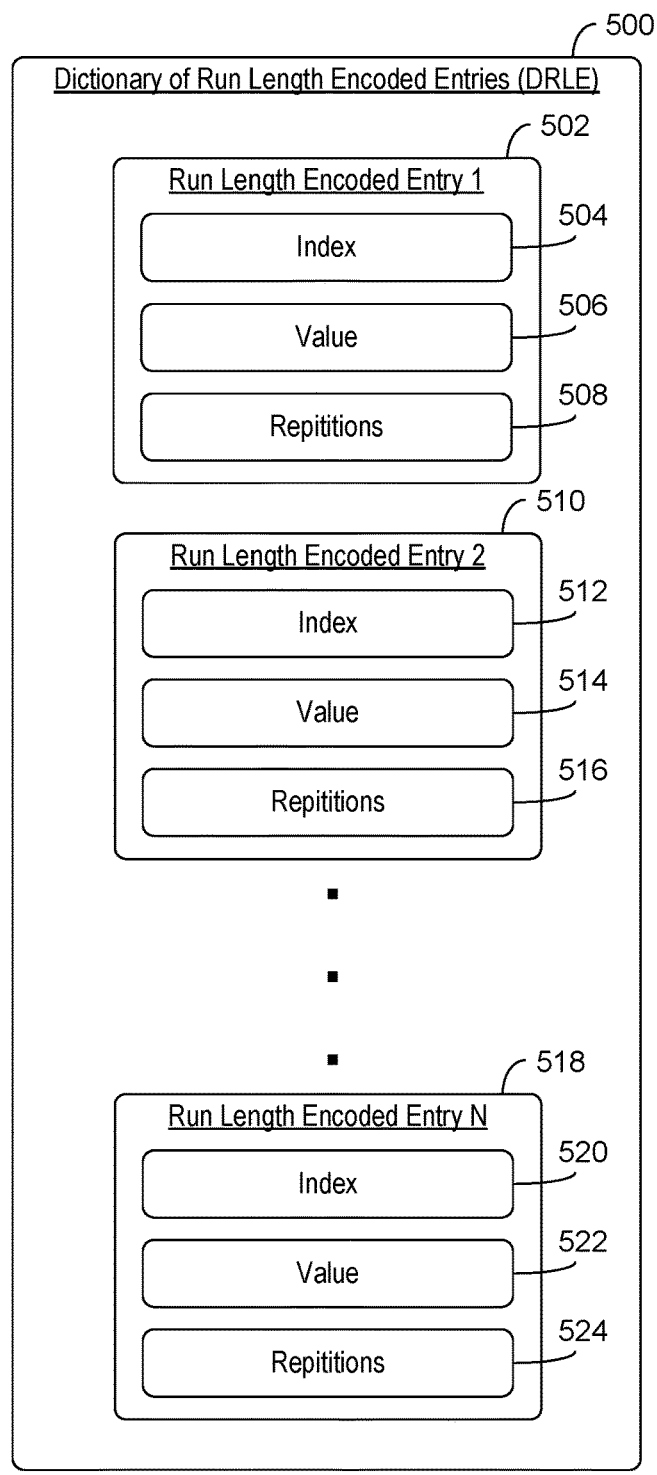
FIG. 5 illustrates exemplary entries for dictionary of run length encoded data (DRLE) in accordance with an exemplary embodiment of the disclosed technology.

FIG. 5 illustrates exemplary entries 500 (e.g., 502, 510, 518) for dictionary of run length encoded data (DRLE). While only three entries 502, 510, 518 are shown in FIG. 5, those having ordinary skill in the art will understand that any suitable number of entries may be included, as desired. Run length encoded entry 1 502 is shown including index information 504, value information 506, and repetitions information 508. Similarly, run length encoded entry 2 510 is shown including index information 512, value information 514, and repetitions information 516. Further still, length encoded entry N 518 is shown including index information 5520, value information 552, and repetitions information 524. Because each entry 502, 510, 518 adopts the same format, the following examples refer to run length encoded entry 1 502, however, the following examples could apply equally to run length encoded entries 2 510 and N 518 as well. Index information 504 reflects the index of the value in the data being processed. Value information 506 reflects the actual numerical value of the data being processed. Finally, Repetitions information 508 reflects the number of times the actual numerical value of the data being processed repeats. By way of continued example and with continued regard to entry 1 502, the index information 504 could be "90," the value information 506 could be "1," and the repetitions information 508 could be "91." In one example, if there are multiple repeatable patterns in the data being processed, multiple entries may be recorded. Thus, in such an example, entry 2 510 could reflect the following: index information 512=273, value information 514=2, and repetitions information 516=92. In accordance with the foregoing disclosure, as repeatable patterns are encountered within the data being processed, the computing system disclosed herein is configured to record and maintain a dictionary of such entries.

Returning to FIG. 2, the dictionary run length encoding of run length encoded dictionaries (DRLE2) compression filter 238 operates as follows. A Dictionary of Run-Length Encoded entries, which are entries that capture the pattern of a value repeating multiple times, may also follow a pattern themselves. Accordingly, the DRLE2 compression filter 238 disclosed herein is configured to encode a dictionary of dictionaries: a Dictionary-Run Length Encoding of Run-Length Encoded Dictionaries (i.e., DRLE2).

As an illustrative, but not limiting, example from business intelligence, the sales quarters Q1, Q2, Q3, and Q4 occur for 90, 91, 92, and 92 days in a year. For subsequent years, these quarters occur for the same number of days: 90, 91, 92, 92. Accordingly, instead of encoding 90, 91, 92, 92 as four separate DRLE entries continually for each year, the disclosed technology may save space by encoding that this sequence of four DRLE entries occurs x many times, and save the indexes where it occurs.

Another illustrative, but not limiting, example from business intelligence is the number of days in a month. For example, January has 31 days, February has either 28 or 29 days depending upon whether it is a leap year, March has 31 days, and so on. This pattern of number of days occurs for multiple years and can be encoded more efficiently with DRLE2. For example, in one embodiment of the disclosed technology, each entry in a DRLE2 may store (a) a list of values, (b) a list of counts (number of repetitions of the values), and (c) a list of key-value pairs that saves for each index the number of repetitions.

For example, the previously discussed DRLE encoding technique (without byte shrinking) would encode the sales quarters data for Q1-Q4 as 12 entries, consuming 12×8=96 bytes:

TABLE 1

Encoding Exemplary Sales Quarter Data with DRLE

| Index | Value | Count |
|-------|-------|-------|
| 0     | 0     | 90    |
| 90    | 1     | 91    |
| 181   | 2     | 92    |
| 273   | 3     | 92    |
| 365   | 0     | 90    |
| 455   | 1     | 91    |
| 546   | 2     | 92    |
| 638   | 3     | 92    |
| 730   | 0     | 90    |
| 820   | 1     | 91    |
| 911   | 2     | 92    |
| 1003  | 3     | 92    |

However, in accordance with the teachings herein, the DRLE2 compression filter 238 may be configured to store the same entries using the DRLE2 technique as a single entry (consuming 10 bytes, 9.6× compression ratio):

Values=0, 1, 2, 3
Counts=90, 91, 92, 92
Index=0 repeats 3
Space-Optimal Pattern Identification.

There are a variety of different techniques that may be employed to identify patterns of patterns (referred to herein as a DRLE2 entry or DRLE2 sequence), so as to minimize total space consumed. An ideal sequence is one that strikes a good balance between the space needed to encode the sequence and the number of repetitions. For example, a large DRLE2 sequence that repeats only once does not lead to as much space savings as a shorter sequence that repeats hundreds of times. However, short sequences are not always more space efficient either, because a short sequence may match DRLE entries at cut-off points of irregularity. For example, a short sequence may be stuck in a local optimum where a slightly longer (but still relatively short) sequence could have matched more times and saved more space overall. Because only one DRLE2 sequence is used for the entire DRLE2 dictionary, it is important to find the best DRLE2 sequence. One exemplary approach to finding the best DRLE2 sequence is to pick the DRLE2 sequence with the highest product of "sequence length"*"number of repetitions". To find this product, the disclosed technology may perform an exhaustive search over all possible sequences in the DRLE data. In some embodiments, the space optimal pattern identifier 234 of the DRLE2 compression filter 238 may be used to perform space-optimal pattern identification in accordance with the foregoing teachings.

Fast Pattern Identification.

Because an exhaustive search can be slow, as an optimization, some embodiments of the disclosed technology may include searching for the best sequence using a shifting window of DRLE entries. For example, instead of searching for the ideal sequence over DRLE entries 1-10,000, it may search over the entries 1-100, then over the entries 2-101, 3-102, and so on. Larger window sizes open up the possibility for better compression ratios. Shorter window sizes improve compression speed at the expense of worse compression. In some embodiments, the fast pattern identifier 236 of the DRLE2 compression filter 238 may be used to perform fast pattern identification in accordance with the foregoing teachings.

A small window size of 20 may be effective enough to achieve compression ratios of 1650× over a table with time related data. A window size of 52 may be more effective, because it catches periodicity over 52 weeks in a year, to achieve compression ratios of 2135× over the same table of time related data. After finding the best DRLE2 sequence to use, in some embodiments, the DRLE2 compression filter 238 may be configured to (a) identify as many continual occurrences of this repeating DRLE2 sequence and (b) remove each occurrence from the DRLE dictionary and account for it as one more repetition in the corresponding index entry in the DRLE2 dictionary. In such an embodiment, the DRLE2 compression filter 238 can run only after the DRLE compression filter 232 has run. To reconstruct when decompressing, each entry in DRLE2 is used to generate one or more corresponding entries in DRLE. This means that when decompressing, in some embodiments, the DRLE2 compression filter 238 must run before the DRLE compression filter 232.

Figure 6:
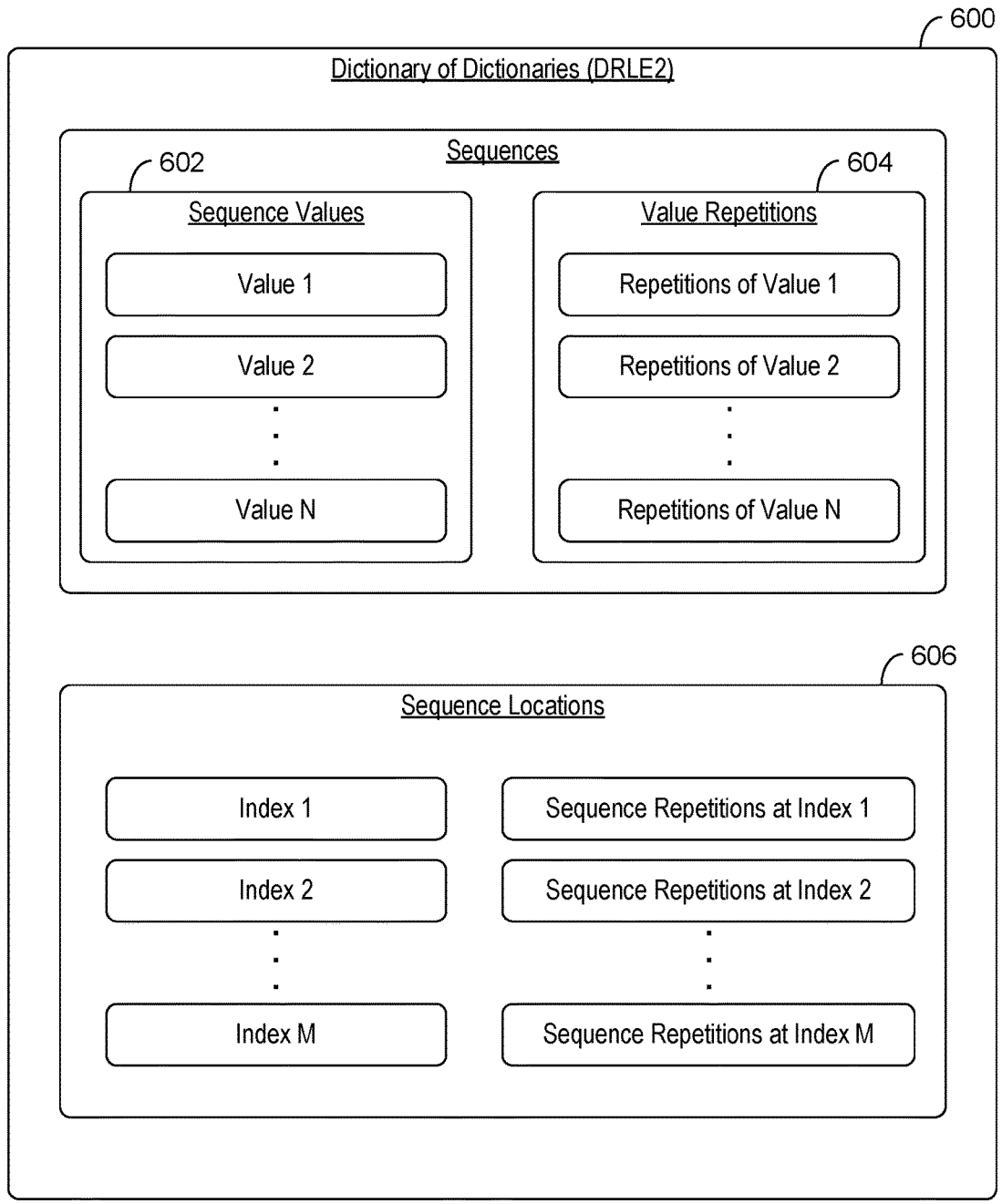
FIG. 6 illustrates exemplary entries for dictionary of dictionaries data (DRLE2) in accordance with an exemplary embodiment of the disclosed technology.

FIG. 6 illustrates exemplary entries 600 for dictionary of dictionaries data (DRLE2) in accordance with an exemplary embodiment of the disclosed technology. Sequence values 602 illustrate various values of the sequences while value repetitions 604 illustrate respective, corresponding repetitions of the sequence values 602. Sequence locations 606 illustrate exemplary dictionary entries for the above dictionary (dictionary of dictionaries) reflecting the sequence locations. For example, index 1 may reflect the sequence while corresponding sequence repetitions at index 1 may reflect the sequence repetitions at this location (index). For example, and with reference to the sales quarter data shown in Table 1 above, the sales quarter data shown in Table 1 above may be recorded in DRLE2 as follows:

Sequence Value 1=0; Sequence Value 2=1; Sequence Value N=2.

Repetitions of Value 1=90; Repetitions of Value 2=91; Repetitions of Value N=92.

Index 1=0

Sequence Repetitions at Index 1=3.

Returning to FIG. 2, the week of encoding compression filter 240 operates as follows. A common pattern in high-performance decision support of business intelligence data is to save the week of the year for each day in the year. The week of the year spans the range of values from 1-53. It is not possible to capture the week of the year using DRLE2, because it is not a constant pattern. The pattern continually changes depending on the year.

For example, the week of year in one year may be: 1111111222222223333333 . . . 52525252 (for ease of presentation assume 52 doesn't mean weak 5 followed by week 2 but instead means week 52) but then the week of the year for the next year may be 11122222223333333 . . . 52525252525252535353, which ends with week 53. Accordingly, DRLE2 often fails to find a sequence that continually repeats over multiple years because of the irregularity of the week of the year when years change. The number of weeks in some years is 53, not 52. Additionally, since the repeating weeks of the year are short runs, DRLE consumes a significant amount space to encode each of the 52 (or 53) runs.

For shorter repeating weeks, like when encoding the week of the month (spanning the range 1-6) instead of the week of the year, a better encoding may be the existing RLE compression filter 230, or a variation of it. However, RLE still fails to express the full picture: that this is a pattern of weeks of a year. Only the Week Of Encoding compression filter 240 described herein may fully expresses this pattern The Week Of Encoding compression filter 240 may be configured to save the following information: (a) the first value (e.g., the value "1"), (b) the number of repetitions of the first value (e.g., the value "3"), (c) the total number of days encoded (e.g., up to 365 or 366 for a full year), and (d) the index where this pattern occurred.

Index Omission and Forced Week of.

As an optimization, in some embodiments, the disclosed technology may omit saving the index where this pattern occurred in order to save space. To do so, the disclosed technology may force all the data to be saved using Week Of Encoding, such that the index of the data is no longer needed to reconstruct the data.

Figure 4:
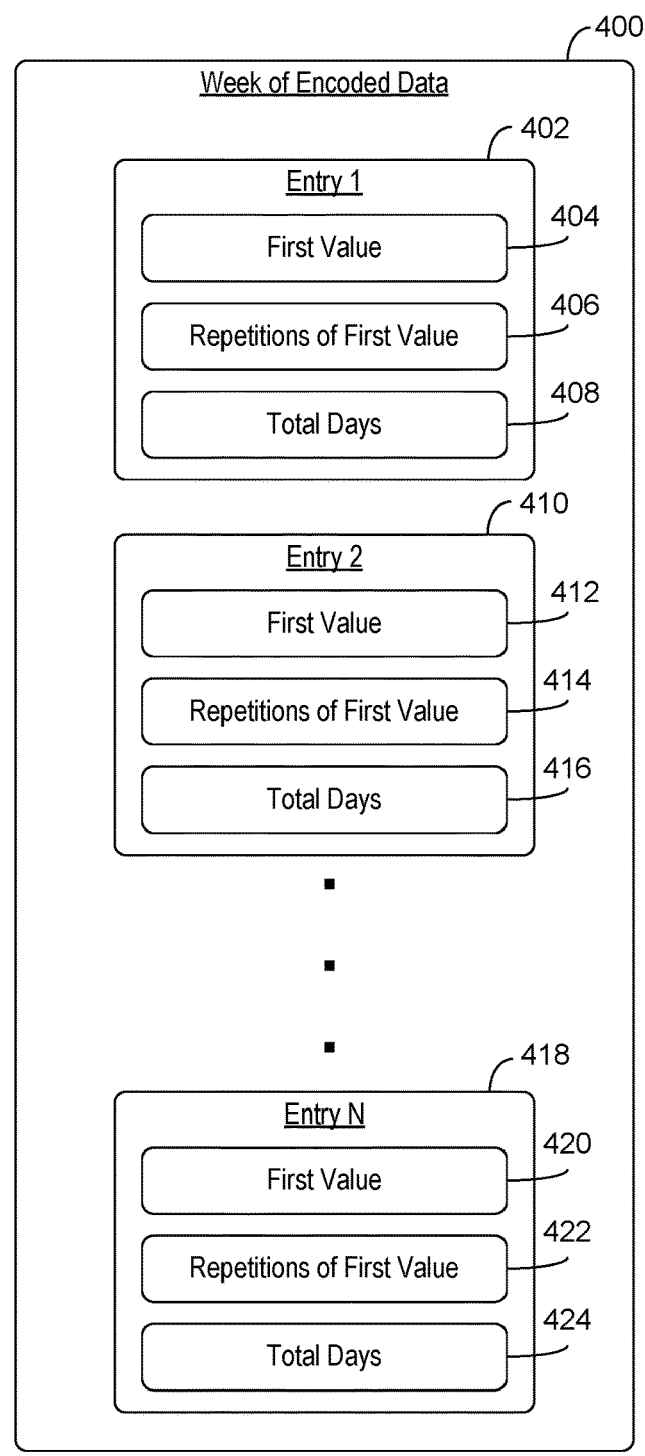
FIG. 4 illustrates exemplary entries for week of encoded data in accordance with an exemplary embodiment of the disclosed technology.

FIG. 4 illustrates exemplary entries 400 (e.g., 402, 410, 418) for week of encoded data. While only three entries 402, 410, 418 are shown in FIG. 4, those having ordinary skill in the art will understand that any suitable number of entries may be included, as desired. Entry 1 402 is shown including first value information 404, repetitions of first value information 406, and total days information 408. Similarly, entry 2 410 is shown including first value information 412, repetitions of first value information 414, and total days information 416. Further still, entry N 418 is shown including first value information 420, repetitions of first value information 422, and total days information 424. Because each entry 402, 410, 418 adopts the same format, the following examples refer to week of encoded entry 1 402, however, the following examples could apply equally to week of encoded entries 2 410 and N 418 as well. First value information 404 may include the week of the year, e.g., "1." Repetitions of first value information 406 may reflect the number of repetitions of the first value 404, e.g., "3." Finally, total days information 408 may reflect the total number of days in the year in question, e.g., "365." As shown, there may be multiple week of encoded entries, as illustrated by additional entries 2 410 and N 418, to record data patterns.

Figure 3:
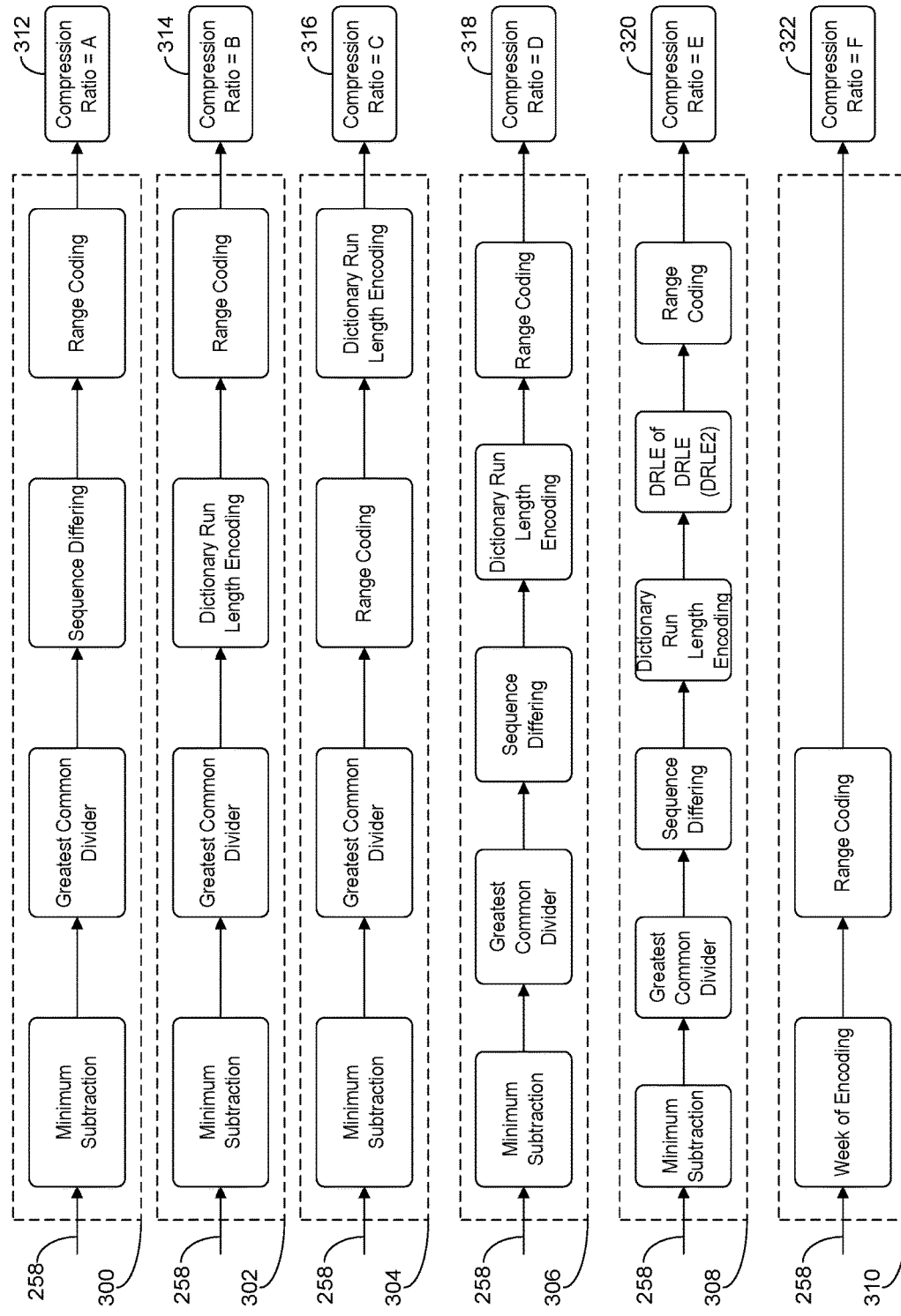
FIG. 3 illustrates a plurality of exemplary compression filter configurations associated with corresponding compression ratios.

Referring now to FIG. 3, a plurality of exemplary candidate compression filter configurations 300, 302, 304, 306, 308, and 310 are shown. Recall that, in certain embodiments of the disclosed technology, the compression planner 212 of the dynamic compression filter selector 204 may be configured to compress the extracted data sample 258 using a variety of different compression filter configurations in order to identify the compression filter configuration associated with the best compression ratio (which identified "optimal" compression filter configuration may be utilized to compress the entire data set 252). As used herein, a given "compression filter configuration" refers to both (i) the types of compression filters included as part of the configuration and (ii) the order, or sequence, of those different types of compression filters.

Different compression filter configurations will be associated with different compression ratios. For example, and as shown in FIG. 3, compression filter configuration 300 is associated with compression ratio A 312, compression filter configuration 302 is associated with compression ratio B 314, compression filter configuration 304 is associated with compression ratio C 316, compression filter configuration 306 is associated with compression ratio D 318, compression filter configuration 308 is associated with compression ratio E 320, and compression filter configuration 310 is associated with compression ratio F 322. The compression filter configurations 300, 302, 304, 306, 308, and 310 shown in FIG. 3 are not exhaustive and any suitable combination of disparate compression filters, in any suitable sequence, may be employed without deviating from the teachings herein.

The compression ratio achieved by a particular compression filter configuration may be dependent based upon not only the indentities, or types, of compression filters utilized, but also on the sequence of those compression filters. For example, as shown in FIG. 3, compression filter configuration 302 and compression filter configuration 304 share the same types of compression filters (i.e., a minimum subtraction compression filter, greatest common divider compression filter, range coding compression filter, and DRLE compression filter). However, the sequence of these shared compression filter types differs between compression filter configuration 302 and compression filter configuration 304. Accordingly, as shown in FIG. 3, compression filter configuration 302 is associated with one compression ratio (i.e., compression ratio B 314), while compression filter configuration 304 is associated with a different compression ratio (i.e., compression ratio C 316). In some embodiment, compression filter configurations sharing the same types of compression filters arranged in different orders may achieve the same compression ratio. However, in other embodiments, compression filter configurations sharing the same types of compression filters arranged in different orders may achieve different compression ratios.

Figure 7:
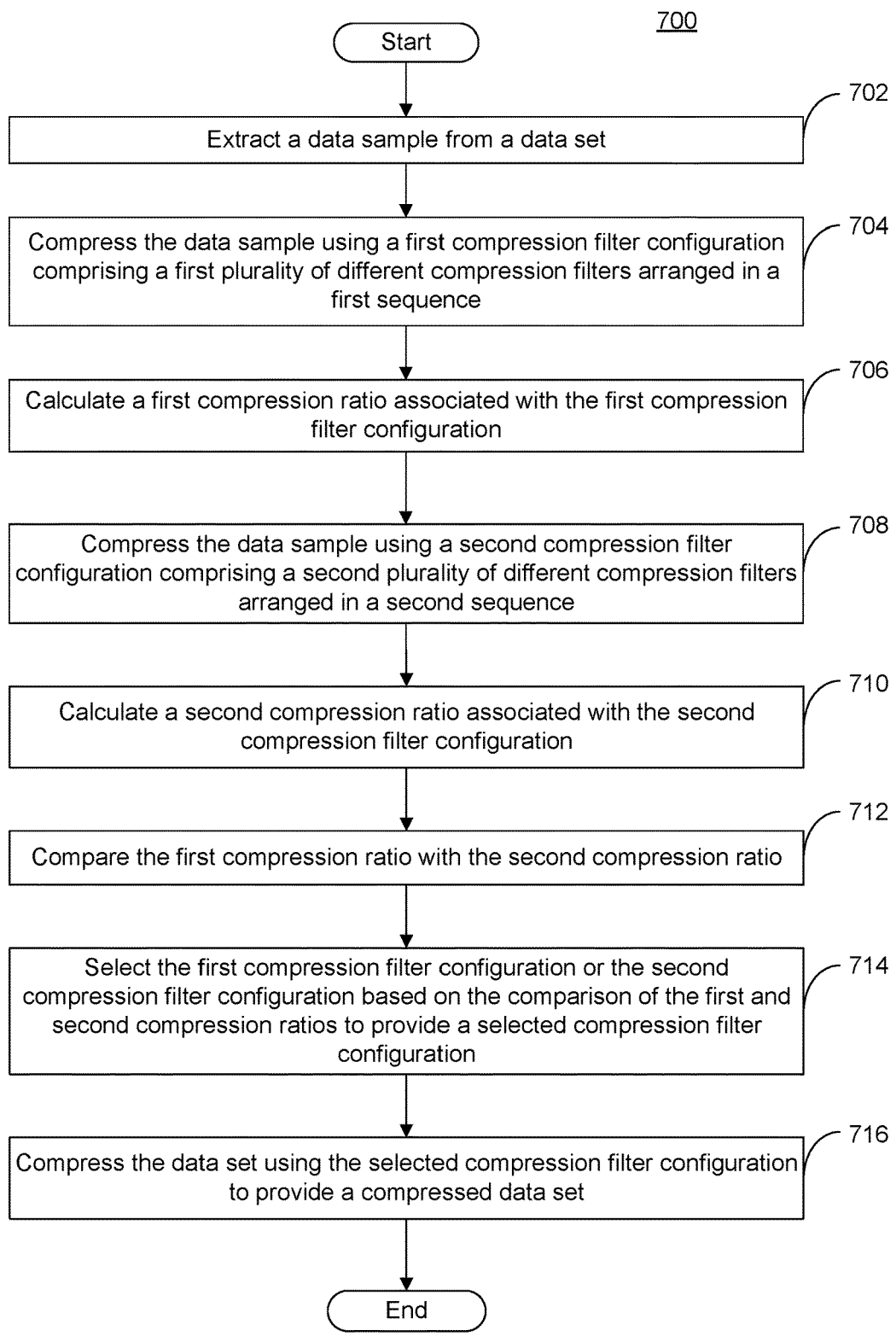
FIG. 7 is a flow chart illustrating a method for performing high-density data compression in accordance with an exemplary embodiment of the disclosed technology.

Referring now to FIG. 7, a flow chart of a method 700 for performing high-density data compression is provided in accordance with an example implementation of the disclosed technology. The method 700 begins at block 702 where a processor, such as CPU 102 of FIG. 1, extracts a data sample from a data set. At block 704, the processor compresses the data sample using a first compression filter configuration including a plurality of different compression filters arranged in a first sequence. At block 706, the processor calculates a first compression ratio associated with the first compression filter configuration.

At block 708, the processor compresses the data sample using a second compression filter configuration including a second plurality of different compression filters arranged in a second sequence. At block 710, the processor calculates a second compression ratio associated with the second compression filter configuration. At block 712, the processor compares the first compression ratio with the second compression ratio. At block 714, the processor selects the first compression filter configuration or the second compression filter configuration based on the comparison of the first and second compression ratios to provide a selected compression filter configuration. Finally, at block 716, the processor compresses the data set using the selected compression filter configuration to provide a compressed data set.

Certain implementations of the disclosed technology are described above with reference to block and flow diagrams of systems and methods and/or computer program products according to example implementations of the disclosed technology. It will be understood that one or more blocks of the block diagrams and flow diagrams, and combinations of blocks in the block diagrams and flow diagrams, respectively, can be implemented by computer-executable program instructions. Likewise, some blocks of the block diagrams and flow diagrams may not necessarily need to be performed in the order presented, may be repeated, or may not necessarily need to be performed at all, according to some implementations of the disclosed technology.

These computer-executable program instructions may be loaded onto a general-purpose computer, a special-purpose computer, a processor, or other programmable data processing apparatus to produce a particular machine, such that the instructions that execute on the computer, processor, or other programmable data processing apparatus create means for implementing one or more functions specified in the flow diagram block or blocks. These computer program instructions may also be stored in a computer-readable memory that can direct a computer or other programmable data processing apparatus to function in a particular manner, such that the instructions stored in the computer-readable memory produce an article of manufacture including instruction means that implement one or more functions specified in the flow diagram block or blocks. As an example, implementations of the disclosed technology may provide for a computer program product, including a computer-usable medium having a computer-readable program code or program instructions embodied therein, said computer-readable program code adapted to be executed to implement one or more functions specified in the flow diagram block or blocks. The computer program instructions may also be loaded onto a computer or other programmable data processing apparatus to cause a series of operational elements or steps to be performed on the computer or other programmable apparatus to produce a computer-implemented process such that the instructions that execute on the computer or other programmable apparatus provide elements or steps for implementing the functions specified in the flow diagram block or blocks.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, can be implemented by special-purpose, hardware-based computer systems that perform the specified functions, elements or steps, or combinations of special-purpose hardware and computer instructions.

Certain implementations of the disclosed technology are described above with reference to mobile computing devices. Those skilled in the art recognize that there are several categories of mobile devices, generally known as portable computing devices that can run on batteries but are not usually classified as laptops. For example, mobile devices can include, but are not limited to portable computers, tablet PCs, Internet tablets, PDAs, ultra mobile PCs (UMPCs) and smartphones.

In this description, numerous specific details have been set forth. It is to be understood, however, that implementations of the disclosed technology may be practiced without these specific details. In other instances, well-known methods, structures and techniques have not been shown in detail in order not to obscure an understanding of this description. References to "one implementation," "an implementation," "example implementation," "various implementations," etc., indicate that the implementation(s) of the disclosed technology so described may include a particular feature, structure, or characteristic, but not every implementation necessarily includes the particular feature, structure, or characteristic. Further, repeated use of the phrase "in one implementation" does not necessarily refer to the same implementation, although it may.

Throughout the specification and the claims, the following terms take at least the meanings explicitly associated herein, unless the context clearly dictates otherwise. The term "connected" means that one function, feature, structure, or characteristic is directly joined to or in communication with another function, feature, structure, or characteristic. The term "coupled" means that one function, feature, structure, or characteristic is directly or indirectly joined to or in communication with another function, feature, structure, or characteristic. The term "or" is intended to mean an inclusive "or." Further, the terms "a," "an," and "the" are intended to mean one or more unless specified otherwise or clear from the context to be directed to a singular form.

As used herein, unless otherwise specified the use of the ordinal adjectives "first," "second," "third," etc., to describe a common object, merely indicate that different instances of like objects are being referred to, and are not intended to imply that the objects so described must be in a given sequence, either temporally, spatially, in ranking, or in any other manner.

While certain implementations of the disclosed technology have been described in connection with what is presently considered to be the most practical and various implementations, it is to be understood that the disclosed technology is not to be limited to the disclosed implementations, but on the contrary, is intended to cover various modifications and equivalent arrangements included within the scope of the appended claims. Although specific terms are employed herein, they are used in a generic and descriptive sense only and not for purposes of limitation.

This written description uses examples to disclose certain implementations of the disclosed technology, including the best mode, and also to enable any person skilled in the art to practice certain implementations of the disclosed technology, including making and using any devices or systems and performing any incorporated methods. The patentable scope of certain implementations of the disclosed technology is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method comprising:
   extracting, by a processor, a data sample from a set of uncompressed data;
   compressing, by the processor, the data sample using a first compression filter configuration comprising a first plurality of different compression filters arranged in a first sequence;
   calculating, by the processor, a first compression ratio associated with the first compression filter configuration;
   compressing, by the processor, the data sample using a second compression filter configuration comprising a second plurality of different compression filters arranged in a second sequence;
   calculating, by the processor, a second compression ratio associated with the second compression filter configuration;
   comparing, by the processor, the first compression ratio with the second compression ratio;
   selecting, by the processor, the first compression filter configuration or the second compression filter configuration based on the comparison of the first and second compression ratios to provide a selected compression filter configuration; and
   compressing, by the processor, the set of uncompressed data using the selected compression filter configuration to provide a compressed data set.

2. The method of claim 1, wherein the first plurality of different compression filters is the same as the second plurality of different compression filters and wherein the first sequence is different than the second sequence.

3. The method of claim 1, wherein at least one of the first plurality of different compression filters is selected from a group consisting of:
   dictionary run-length encoding;
   dictionary run-length encoding of run-length encoding dictionaries; and
   week-of encoding.

4. The method of claim 1, wherein at least one of the second plurality of different compression filters is selected from a group consisting of:
   dictionary run-length encoding;
   dictionary run-length encoding of run-length encoding dictionaries; and
   week-of encoding.

5. The method of claim 1, further comprising:
   reducing, by the processor, a size of the compressed data set by performing at least one of:
   dictionary run-length encoding index omission;
   dictionary run-length encoding byte shrinking;
   data byte shrinking; and
   range encoding.

6. A computing system comprising:
   memory comprising executable instructions; and
   a processor operatively connected to the memory, the processor configured to execute the executable instructions in order to effectuate a method comprising:
      extracting a data sample from a set of uncompressed data;
      compressing the data sample using a first compression filter configuration comprising a first plurality of different compression filters arranged in a first sequence;
      calculating a first compression ratio associated with the first compression filter configuration;
      compressing the data sample using a second compression filter configuration comprising a second plurality of different compression filters arranged in a second sequence;

calculating a second compression ratio associated with the second compression filter configuration;

comparing the first compression ratio with the second compression ratio;

selecting the first compression filter configuration or the second compression filter configuration based on the comparison of the first and second compression ratios to provide a selected compression filter configuration; and compressing the set of uncompressed data using the selected compression filter configuration to provide a compressed data set.

7. The computing system of claim 6, wherein the first plurality of different compression filters is the same as the second plurality of different compression filters and wherein the first sequence is different than the second sequence.

8. The computing system of claim 6, wherein at least one of the first plurality of different compression filters is selected from a group consisting of:
dictionary run-length encoding;
dictionary run-length encoding of run-length encoding dictionaries; and
week-of encoding.

9. The computing system of claim 6, wherein at least one of the second plurality of different compression filters is selected from a group consisting of:
dictionary run-length encoding;
dictionary run-length encoding of run-length encoding dictionaries; and
week-of encoding.

10. The computing system of claim 6, wherein the processor is configured to execute the executable instructions in order to effectuate the method further comprising:
reducing, by the processor, a size of the compressed data set by performing at least one of:
dictionary run-length encoding index omission;
dictionary run-length encoding byte shrinking;
data byte shrinking; and
range encoding.

11. A non-transitory computer-readable medium comprising executable instructions that when executed by a processor cause the processor to effectuate a method comprising:
extracting a data sample from a set of uncompressed data;
compressing the data sample using a first compression filter configuration comprising a first plurality of different compression filters arranged in a first sequence;
calculating a first compression ratio associated with the first compression filter configuration;

compressing the data sample using a second compression filter configuration comprising a second plurality of different compression filters arranged in a second sequence;

calculating a second compression ratio associated with the second compression filter configuration;

comparing the first compression ratio with the second compression ratio;

selecting the first compression filter configuration or the second compression filter configuration based on the comparison of the first and second compression ratios to provide a selected compression filter configuration; and compressing the set of uncompressed data using the selected compression filter configuration to provide a compressed data set.

12. The non-transitory computer-readable medium of claim 11, wherein the first plurality of different compression filters is the same as the second plurality of different compression filters and wherein the first sequence is different than the second sequence.

13. The non-transitory computer-readable medium of claim 11, wherein at least one of the first plurality of different compression filters is selected from a group consisting of:
dictionary run-length encoding;
dictionary run-length encoding of run-length encoding dictionaries; and
week-of encoding.

14. The non-transitory computer-readable medium of claim 11, wherein at least one of the second plurality of different compression filters is selected from a group consisting of:
dictionary run-length encoding;
dictionary run-length encoding of run-length encoding dictionaries; and
week-of encoding.

15. The non-transitory computer-readable medium of claim 11, wherein executing the executable instructions causes the processor to effectuate the method further comprising:
reducing, by the processor, a size of the compressed data set by performing at least one of:
dictionary run-length encoding index omission;
dictionary run-length encoding byte shrinking;
data byte shrinking; and
range encoding.

* * * * *